US 6,693,459 B2

(12) United States Patent
Nedovic et al.

(10) Patent No.: US 6,693,459 B2
(45) Date of Patent: Feb. 17, 2004

(54) METHOD AND SYSTEM FOR IMPROVING SPEED IN A FLIP-FLOP

(75) Inventors: Nikola Nedovic, San Jose, CA (US); Vojin G. Oklobdžija, Berkely, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/045,179

(22) Filed: Jan. 11, 2002

(65) Prior Publication Data

US 2003/0062925 A1 Apr. 3, 2003

Related U.S. Application Data

(60) Provisional application No. 60/323,517, filed on Sep. 17, 2001.

(51) Int. Cl.[7] .............................................. H03K 19/096
(52) U.S. Cl. ......................... 326/93; 326/119; 326/121
(58) Field of Search ............................. 326/93–98, 105, 326/112, 119, 121

(56) References Cited

U.S. PATENT DOCUMENTS

| | | | |
|---|---|---|---|
| 5,900,759 A | | 5/1999 | Tam |
| 5,917,355 A | | 6/1999 | Klass |
| 6,023,179 A | * | 2/2000 | Klass ........................ 327/211 |
| 6,060,909 A | * | 5/2000 | Aipperspach et al. ......... 326/98 |
| 6,201,415 B1 | * | 3/2001 | Manglare ..................... 326/98 |
| 6,362,657 B1 | * | 3/2002 | Mooney ...................... 326/98 |
| 6,456,113 B2 | * | 9/2002 | Kanba ......................... 326/93 |

OTHER PUBLICATIONS

F. Klass, "Semi–Dynamic and Dynamic Flip–Flops with Embedded Logic", Symp. on VLSI Circ. Digest of Technical Papers, Jun. 1998.
H. Partovi, et al. "Flow–Through Latch and Edge–Triggered Flip–Flop Hybrid Elements", ISSCC Digest of Technical Papers, pp. 138–139, Feb. 1996.
V. Stojanovic, V. G. Oklobdzija, "Comparative Analysis of Master–Slave Latches and Flip–Flops for High–Performance and Low–Power Systems", IEEE Journal of Solid–State Circuits, vol. 34, No. 4, pp. 536–548, Apr. 1999.
N. Nedovic, V.G. Oklobdzija, "Dynamic Flip–Flop with Improved Power", Proceedings of International Conference of Computer Design, pp. 323–326, 2000.
R. Heald et al., "A Third–Generation SPARC V9 64–b Microprocessor", IEEE of Solid–State Circuits, vol. 35, Issue 11, pp. 1526–1538, Nov. 2000.

* cited by examiner

*Primary Examiner*—Don Le
(74) *Attorney, Agent, or Firm*—Sheppard Mullin Richter & Hampton LLP

(57) ABSTRACT

The present invention provides techniques, including a system and method, for improving speed in a flip-flop, having a pre-charged stage coupled to an evaluation stage. In one exemplary embodiment delay is reduced by using a conditional rather than an unconditional keeper, where the conditional keeper has the function of a keeper only under certain conditions. In some embodiments there is a conditional keeper in either the pre-charged stage or the evaluation stage or both stages. Another embodiment provides for the combining of the evaluation stage with one or more external logic functions.

40 Claims, 9 Drawing Sheets

METHOD AND SYSTEM FOR IMPROVING SPEED IN A FLIP-FLOP

CROSS REFERENCES

This application claims priority from and incorporates by reference in its entirety U.S. Provisional Application Serial No. 60/323,517, titled "A Method And System For Improving Speed In A Flip-Flop" by Nikola Nedovic, et. al., filed Sep. 17, 2001.

FIELD OF THE INVENTION

The invention relates generally to the field of electronic circuit design, and in particular to techniques for improving speed in a digital logic circuit, for example, a digital logic flip-flop circuit.

BACKGROUND OF THE INVENTION

The Semi-Dynamic Flip-Flop (SDFF) is one of the high performance flip-flops based on the hybrid concept. In part due to its size, low clock-to-output delay, negative set-up time, and simple topology, it is considered to be one of the fastest flip-flops today. However, the SDFF is susceptible to a hazard condition, when both the input and output are at a high logic value.

FIG. 1 shows a schematic circuit diagram of a typical prior art SDFF. The data input is D 312, the clock signal is CLK0 314, and the outputs are Q 316 and Qbar 317. The two inverters inv5 318 and inv6 319 are a "keeper" circuit which maintains the value of output Qbar 317 and hence output Q 316. A transparency window for the SDFF is given by the propagation delay of the two inverters, inv1 350 and inv2 352, and the NAND gate 354. The internal node X 320 of the first stage 330 of the SDFF is set to a high logic level (H), when the clock CLK0 314 is at a low logic level (L), i.e., the first stage 330 is pre-charged. When the input signal D 312 is H, node X 320 transitions from H to L in the transparency window where both CLK0 314 and S 356 are H (transistors Mn1 346, Mn2 344, and Mn3 342 are on). The second stage 332 captures the transition on node X 320 generated by the first stage 330 and produces output Q 316. In this case node X 320 sets output Q 316 to H via transistor Mp2 374. If input D 312 is L, Mn2 344 is off and node X 320 remains high during the transparency window. With node X 320 at H, output Q 316 is set at L during the transparency window (transistors Mn4 370 and Mn5 372 are on).

FIG. 2 is an example timing diagram for the SDFF schematic circuit diagram of FIG. 1 showing a glitch in the output. The timing diagram shows the clock signal CLK0 410 representing the CLK0 314 in FIG. 3. D 414, X 416, and Q 418 show the signals for D 312, node X 320, and Q 316 in FIG. 3 respectively. From FIG. 2, after the rising edge 430 of CLK0 410 and with D 414 set to L, X 416 remains at H and output Q 418, due to transistors Mn4 370 and Mn5 372, transitions from H to L 434. After another rising edge 440 of CLK0 410 and with D 414 at H, X 416 transitions from H to L 442 due to transistors Mn1 346, Mn2 344, and Mn3 342 turning on. Next output Q 418 transitions from L to H 444 due to transistor Mp2 374. Thus the L to H transition of output Q, e.g., 444, is done using in effect an inverting intermediate node X 320, while the transition of output Q, e.g., 434, from H to L is done directly via nMOS transistors and avoids the slower pMOS transistors. The SDFF is used where the time critical output transitions are from L to H, e.g., 444, on output Q 316, and thus the node X transition, e.g., H to L 442, is important.

However, the asymmetrical transition times of the SDFF lead to a "static-one-hazard" at the output Q when both input D and output Q are H. In FIG. 2, before the rising edge 450 of the CLK0 410, X 416 is set (or reset) to H by transistor Mp1 340. Because the first stage 330 has a non-zero propagation delay from the time of the rising clock edge 450 to the time X 416 transitions from H to L 454, the second stage 332 uses the previous X (H). Hence during the time window between the rising edge 450 of the clock CLK0 410 and the falling edge 454 of X 416, both Mn4 370 and Mn5 372 in FIG. 1 are on and the output Q 316 is pulled to low logic level (e.g., transition 452). After the propagation delay, i.e., the falling transition 454 of X 416, the transistor Mp2 372 turns on (and Mn4 370 turns off), and the output Q 316 is pulled to H (e.g., transition 456). Thus a glitch 462 is caused on the output Q 418 (and Qbar 420) and makes the use of the SDFF hazardous. In addition the glitch consumes power unnecessarily, as output Q 316 should not change, since input D 312 has not changed. Hence some improved flip-flop is needed that has faster or substantially the same speed as the SDFF without the hazard.

There is also a problem of power consumption and increased delay due to the unconditional keepers of the SDFF (back-to-back inverters, inv3 360 and inv4 362, and back-to-back inverters, inv5 318 and inv6 319, of FIG. 1). The keeper is used to hold the value of a dynamic node, e.g., node X 320 or out put Q 316, that would otherwise be in high impedance and thus sensitive to leakage current effects and noise. The problem is that in order to change the value of the dynamic node, the keeper has to be overpowered (two keepers, in the case of the SDFF), i.e., the output logic level of the keeper needs to be switched, which increases power consumption and delay. From FIG. 2 it is necessary to fight the keepers on every change of node X 416, e.g., transitions 454, 472, and 442, and on every change of output Q 418, e.g., transitions 452, 456, 434, and 444. Hence while the function of the keeper adds to the robustness of the flip-flop, it introduces delay or slow down of the flip-flop.

Therefore with the problems of a hazard, delay, and power consumption with the SDFF, there is a need for an improved flip-flop with less problems. In addition there is a need for a flip-flop that has the robustness provided by the keeper circuit, but with improved speed.

SUMMARY OF THE INVENTION

The present invention provides techniques, including a system and method, for improving speed in a flip-flop, having a pre-charged stage coupled to an evaluation stage. In one exemplary embodiment delay is reduced by using a conditional rather than an unconditional keeper, where the conditional keeper has the function of a keeper only under certain conditions. In some embodiments there is a conditional keeper in either the pre-charged stage or the evaluation stage or both stages. Another embodiment of the present invention allows for the combining of the evaluation stage with one or more external logic functions.

Broadly the present invention provides a method for conditionally maintaining a logic level of a node in flip-flop circuit. During a first part of a periodic time interval, the logic level of the node is maintained by feeding back to the node the logic level after two inversions. Next, and during a second part of the periodic interval, the logic level of the node is not maintained by disconnecting the feeding back to the node.

In another aspect of the present invention a conditional keeper circuit for conditionally maintaining a logic level of a node in flip-flop circuit is provided. The flip-flop circuit includes a pre-charged stage coupled to an evaluation stage. The conditional keeper circuit includes: an inverter circuit connected to the node; an inverted tri-state circuit connected to the inverter circuit and to the node; and a control circuit that sends a signal to set said inverted tri-state circuit to a high impedance state for a fixed time period.

Yet another aspect of the present invention comprises a system for improving speed in a hybrid type flip-flop is provided. The system includes, a pre-charge stage for determining a pre-charge stage output depending upon a data input during a first part of a transparency window. The pre-charge stage includes a first conditional keeper for keeping the pre-charge stage output. And an evaluation stage for evaluating the pre-charge stage output to produce a data output during a second part of the transparency window. The evaluation stage includes a second conditional keeper for keeping the data output. And when outside of the transparency window, either the first conditional keeper is operating like an unconditional keeper or the second conditional keeper is operating like an unconditional keeper.

The present invention also comprises a method for reducing delay in a flip-flop, including, a pre-charged stage coupled to an evaluation stage by at least an internal node. First, a first keeping circuit of the pre-charged stage is disconnected in at least a first portion of a transparency window, where the first keeping circuit maintains a first logic level on the internal node. Next, the internal node is set to a second logic value after the disconnecting the first keeping circuit; Optionally, a second keeping circuit of the evaluation stage is disconnected in at least a second portion of the transparency window, where the second keeping circuit maintains a third logic level on an output of the evaluation stage. Lastly, the output is set to a fourth logic level based on the second logic value after the disconnecting the second keeping circuit.

A further aspect of the present invention comprises a system for improving performance of a hybrid type flip-flop. The system includes a pre-charge stage for receiving a data input and setting an internal node and an evaluation stage for setting a data output, where the evaluation stage is connected to the pre-charge stage by the internal node. The evaluation stage includes a plurality of NAND gates, where the data output is feedback into a NAND gate of the plurality of NAND gates.

In another embodiment of the present invention a method for combining an evaluation stage of a hybrid flip-flop coupled to external digital logic circuitry is provided, where the evaluation stage includes a plurality of NAND gates. First, the external logic gates in the external digital logic circuitry are identified. Next, a Boolean logic minimization is performed using the external logic gates and the plurality of NAND gates. And lastly, the evaluation stage and the external logic gates are combined.

These and other embodiments, features, aspects and advantages of the invention will become better understood with regard to the following description, appended claims and accompanying drawings.

BRIEF DESCRIPTION OF THE DRAWINGS

FIGS. 9-1, 9-2, 9-3 and 9-4 show examples of the second stages of two flip-flops being combined for some embodiments of the present invention.

DETAILED DESCRIPTION OF THE INVENTION

In the following description, numerous specific details are set fourth to provide a more thorough description of the specific embodiments of the invention. It is apparent, however, to one skilled in the art, that the invention may be practiced without all the specific details given below. In other instances, well known features have not been described in detail so as not to obscure the invention.

Figure 3:
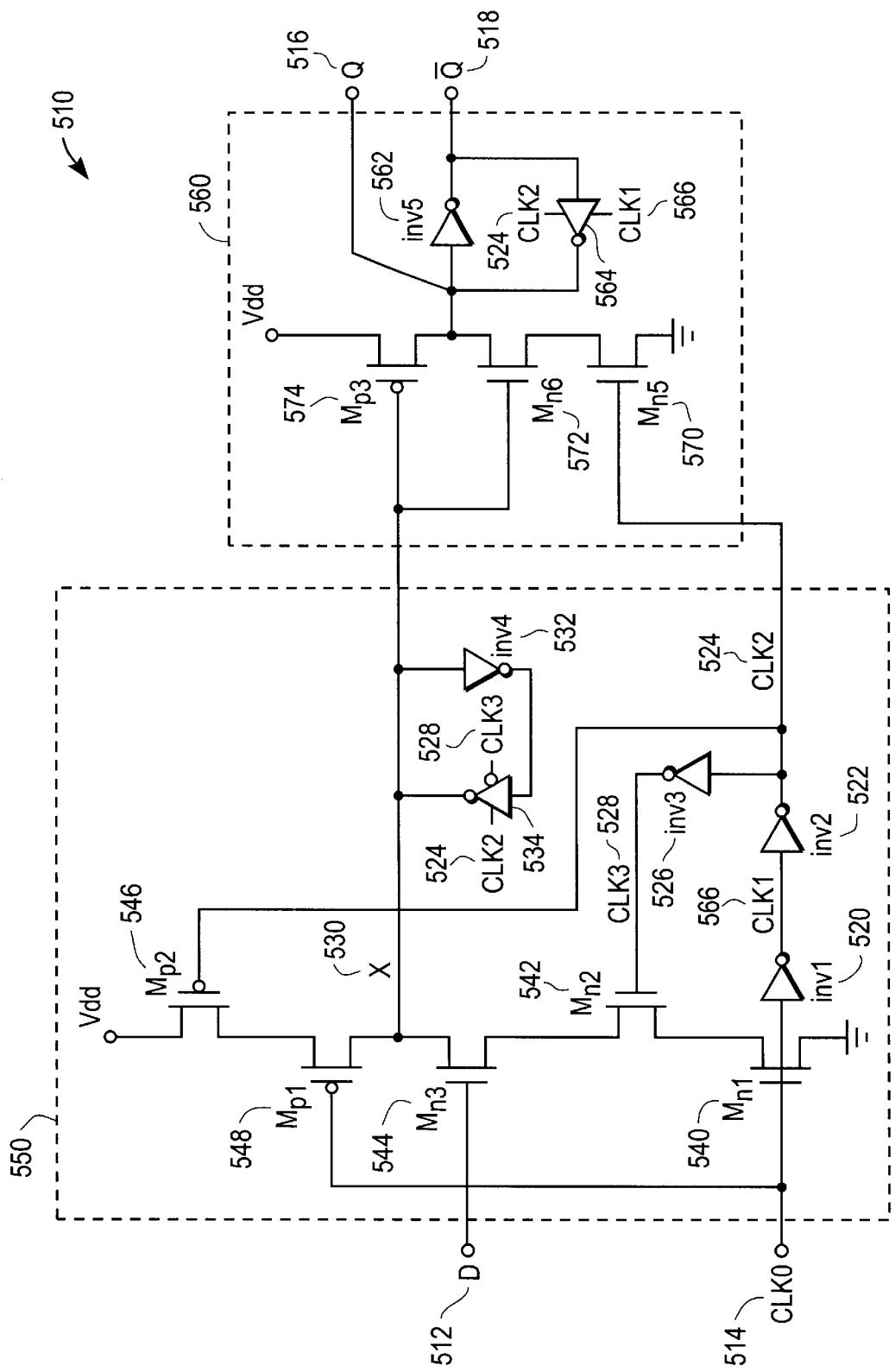
FIG. 3 is a schematic circuit diagram of a flip-flop of one embodiment of the present invention.

FIG. 3 illustrates a simplified circuit diagram of a flip-flop of one embodiment of the present invention. The D type flip-flop 510 shown has input D 512, clock CLK0 514, output Q 516 and inverted output Qbar 518. Clock CLK1 566 is the clock CLK0 514 inverted and delayed by the inverter inv1 520. Clock CLK2 524 is the clock CLK0 514 delayed by the inverters inv1 520 and inv2 522. Clock CLK3 528 is the clock CLK0 514 inverted and delayed by the three inverters inv1 520, inv2 522, and inv3 526. There is an internal node X 530 which connects the first or a pre-charge stage 550 to the second or evaluation stage 560. In addition the clock CLK2 524 is also input into the second stage 560.

There are two conditional keepers that in general maintain the value of the outputs of the first and second stages mostly outside of the transparency window, where the transparency window includes the delay of the three inverters inv1 520, inv2 522, and inv3 526. The first conditional keeper maintains output Q 516 (and Qbar 518) and includes inverter inv5 562 connected to the inverted tri-state circuit 564. The inverted tri-state circuit 564 has outputs: high logic level (H), low logic level (L), and open circuit, i.e., high impedance (Z). The inverted tri-state circuit 564 is conducting when both the clock CLK1 566 is H and the clock CLK2 524 is L. The inverted tri-state circuit 564 is open or high impedance (Z), when either CLK1 566 is L or CLK2 524 is H. In an alternative embodiment the inverted tri-state circuit 564 is open or high impedance (Z), when CLK1 566 is L and CLK2 524 is H, and closed otherwise. The second conditional keeper maintains node X 530 and includes inverter inv4 532 connected to the inverted tri-state circuit 534. The inverted tri-state circuit 534 is conducting when both the clock CLK2 524 is H and the clock CLK3 528 is L. The inverted tri-state circuit 534 is open or high impedance (Z), when either CLK2 524 is L or CLK3 528 is H. In an alternative embodiment the inverted tri-state circuit 534 is open or high impedance (Z), when CLK2 524 is L and CLK3 528 is H, and closed otherwise.

The basic operation of FIG. 3 is explained as follows: when CLK0 514 goes H, CLK2 524 disables the ability to set the output Q 516 of the evaluation or second stage (via transistor Mn5 570) from being set L for a predetermined time period, e.g., the delay of the two inverters inv1 520 and inv2 522, so that the output of the pre-charge or first stage 550, i.e., node X 530, can be set. Then after node X 530 is set, output Q 516 is set. This prevents the glitch 462 of the SDFF illustrated in FIG. 2 from occurring. In addition CLK2 524 via transistor Mp2 546 delays the pre-charging of node X 530 to its default H value, until after the evaluation stage 560 is disabled from being set to L. This prevents the a fast charging of node X 530, when the CLK0 514 goes L, from affecting the output Q 516.

Figure 4:
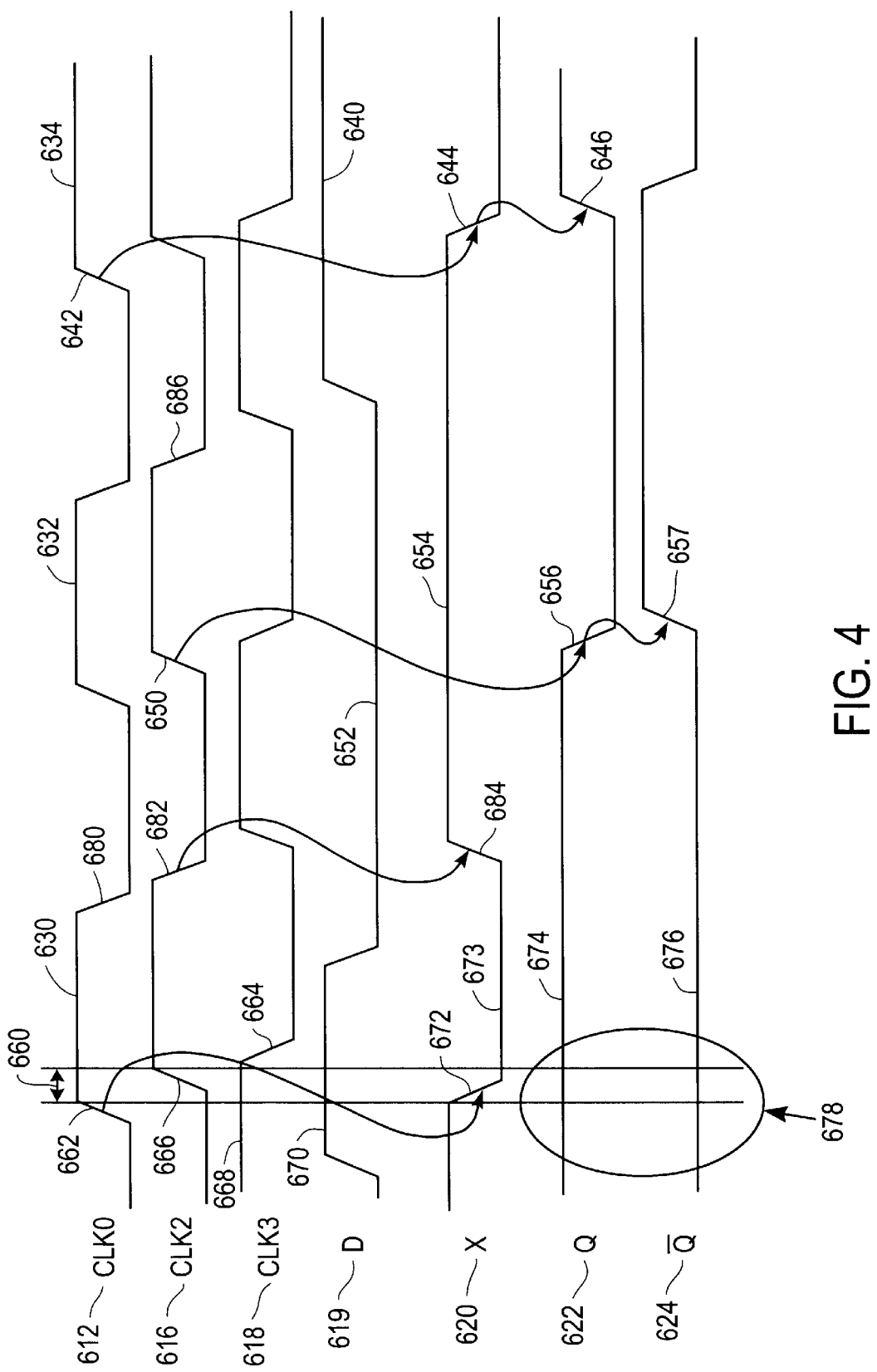
FIG. 4 shows an example of a simplified timing diagram for the embodiment of FIG. 3.

FIG. 4 shows an example of a simplified timing diagram for the embodiment of FIG. 3. The signals shown in FIG. 4, i.e., clock CLK0 612, clock CLK2 616, clock CLK3 618, input D 619, X 620, output Q 622, and output Qbar 624, correspond respectively to clock CLK0 514, clock CLK2 524, CLK3 528, input D 512, node X 530, output Q 516, and output Qbar 518 in FIG. 3. For illustration purposes only there are three clock CLK0 612 cycles shown, cycle 630, cycle 632, and cycle 634. An example of a transparency window is the time interval from the rising edge 662 of clock CLK0 612 to the falling edge 664 of clock CLK3 618, i.e., both CLK0 612 and CLK3 are H. An example of a disable window 660 is shown for the time period from after the clock CLK0 612 rising edge 662 to after the rising edge 666 of clock CLK2 616. During this disable window the evaluation stage 560 is disabled from having its output set to L. X 620 needs to transition from its default (H) to L, e.g. transition 672, in this disable window. In other embodiments the disable window may be from before, during or after the rising edge 662 of clock CLK0's 612 to before, during or after the rising edge 666 of clock CLK2 616. The main criteria for setting the disable window is that X 620 and CLK2 616 are not both simultaneously at a high logic level (H) in this disable time period. Otherwise Mn5 570 and Mn6 572 may both be on, pulling output Q 516 to L and potentially causing a glitch on the output Q 516 like the SDFF circuit.

In FIG. 4 cycles 632 and 634 show the operation of the D type flip-flop 510 in changing the output Q 622 from H to L 656 and from L to H 646. The rising edge 642 of cycle 634 of clock CLK0 612, when D 619 is H 640, causes transistor Mn1 540 to turn on and transition X 620 from H to L 644 via transistors Mn1 540, Mn2 542, and Mn3 544. Next output Q 622 is pulled to H (transition 646) by transistor Mp3 574. The rising edge 650 in cycle 632 of clock CLK2 616, when D 619 is L 652, maintains H 654 on X 620, and causes transistor Mn5 570 to pull output Q 622 to L (transition 656). Thus like the H to L transition 434 of output Q 418 (FIG. 2) of the SDFF, the H to L transition 656 of the output Q 622 of this embodiment is done directly, i.e., does not involve a transition of X 620.

For cycle 630 of clock CLK0 612 the rising edge 662 causes transistor Mn1 540 to turn on. When the input D 619 is H 670, node X 620 is pulled to L via transistors Mn1 540, Mn2 542, and Mn3 544, e.g., transition 672. This H to L transition 672 is fast and is within the disable period 660. Next, the L to H transition 666 of clock CLK2 616 turns Mn5 570 on and since X 620 is L, Q 622 is set to H via transistor Mp3 574. As Q 622 is already H 674, no change on Q occurs. Thus there is no glitch on output Q 622 (or Qbar 624) in the area 678.

Another feature of the embodiment of FIG. 3 is the delayed pre-charge of node X 530. This prevents another hazard on the output Q 516, when node X 530 transitions from L to H, i.e., node X 530 is pre-charged. For example, when CLK0 612 transitions from H to L (transition 680), transistor Mp1 548 is turned on. If Mp1 548 was directly connected to node X 530 (no intervening transistor Mp2 546), node X 530 could pre-charge to H before CLK2 524 turns off transistor Mn5 570. If output Q 516 is at H, then node X 530 via path Mn6 572 and Mn5 570, could cause a false switching or glitch (i.e., an unwanted voltage or current spike of short duration, usually unintentionally produced) on output Q 516. Transistor Mp2 546 controlled by clock CLK2 524 insures that transistor Mn5 570 is turned off before node X 530 is pre-charged by transistor Mp1 548.

Referring to FIG. 3 and FIG. 4 the node X conditional keeper, i.e., inverter inv4 532 and inverted tri-state 534, maintains the node X 530 logic value (H or L). For example in FIG. 4, the falling edge 664 on CLK3 618 turns the inverted tri-state 534 on (CLK2 616 is H at falling edge 664), and hence the node X conditional keeper is turned on. Before the falling edge 664 the inverted tri-state 534 and thus the node X conditional keeper is an open circuit or off. Thus a change in X 620, for example, transition H to L 672, can occur within the transparency window without consuming the power necessary to change the state of a conventional keeper, i.e., fighting the keeper.

The output Q conditional keeper, i.e., inverter inv5 562 and inverted tri-state 564, maintains the output Q 516 and Qbar 518. For example, in FIG. 4, the falling edge (not shown) on CLK1 is one inverter delay after the rising edge 662 on CLK0 612. This falling edge turns the inverted tri-state 534 off, and hence the output Q conditional keeper is turned off. Thus the output Q conditional keeper is off during about the second half of the disable window 660 and the remainder of the transparency window. Therefore the output Q 516 may be set without consuming the power necessary to change the state of a conventional keeper.

Generally with some overlap in the transition window, the node X conditional keeper and the output Q conditional keeper alternate, with one being on while the other is off (i.e., open circuit). When the node X conditional keeper is on, CLK2 616 is H, and Mn5 570 is on. The transistors Mn6 572 and Mp3 574 then function as an inverter, passing an inverted node X to output Q 516. Hence the node X conditional keeper maintains the output Q 516. Thus one of the conditional keepers maintains the output Q outside of the transparency window.

Figure 5:
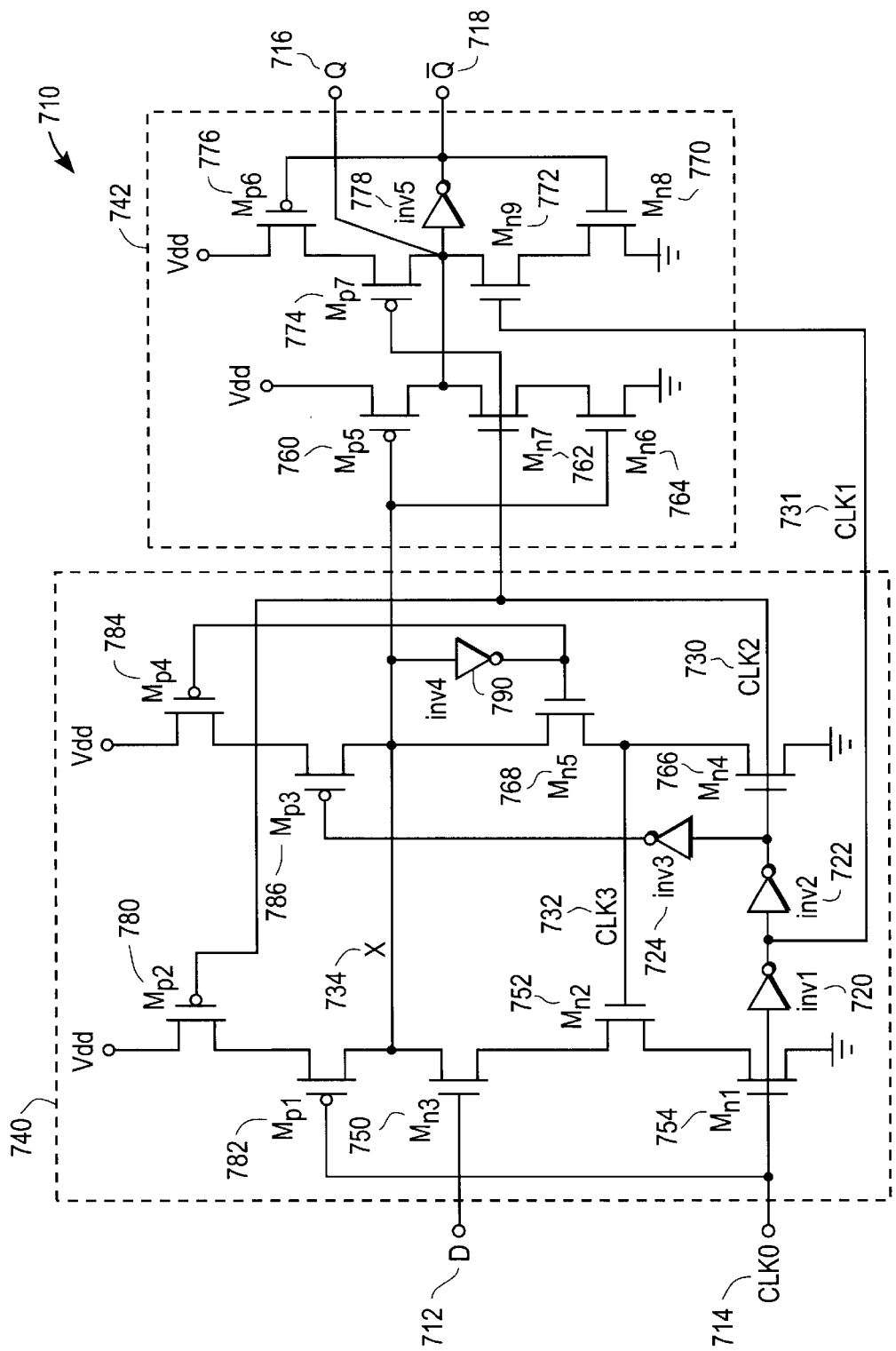
FIG. 5 is a schematic circuit diagram of a second embodiment of the present invention.

FIG. 5 is a schematic circuit diagram of a second embodiment of the present invention. The D type flip-flop 710 has two functional stages: the first or pre-charge stage 740 and the second or evaluation stage 742. The first stage 740 produces a signal at internal node X 734, and the second stage 742 produces the outputs Q 716 and Qbar 718. The first stage 740 is pre-charged (set to the default high logic level(H)) when the input clock CLK0 714 is at the low logic level(L). The first stage 740 allows a closed circuit path (Mn3 750, Mn2 752 and Mn1 754) from node X 734 to ground in the transparency window (i.e., when CLK0= CLK3=H), if the data input D 712 is H. This turns transistor Mp5 760 on and sets the output Q 716 to H. Once the internal node X 734 is pulled to L, transistors Mn4 766 and Mn5 768 keep node X 734 at L for the duration of the high logic level(H) of the delayed clock CLK2 730.

If the input D 712 is L in the transparency window, node X 734 remains at H. The H on node X 734 is kept (restored) after the transparency window, when CLK3 730 goes to L. The H on node X 734, after the rising edge of the delayed clock CLK2 730 causes the output Q 716 to be pulled to L (transistors Mn6 764 and Mn7 762 are on). During the time the input clock CLK0 714 is at L, and when the forward path (transistors Mn6 764, Mn7 762, Mp5 760) is off, the output Q 716 is kept at its logic level by the conditional keeper (transistors Mn8 770, Mn9 772, Mp7 774, Mp6 776 and inverter inv5 778).

The SDFF glitch occurrence (462 in FIG. 2) is prevented by delaying the reset of the output Q 716, i.e., the output Q 716 is connected to ground when the delayed clock CLK2 730 goes to H. This allows the node X 734 to evaluate to L, when input D 712 is H, before node X's transient high level is used to reset the output Q 716. However, this solution may create another potential hazard. When the clock CLK0 714 transitions from H to L, a fast pre-charge of node X 734 (assuming transistor Mp2 780 is absent and Mp1 782 is connected directly to node X 734) and slow propagation of the low logic level of the clock through the inverters inv1 720 and inv2 722 would cause the overlap between the node X 734 at H and CLK2 730 at H. As a result, the transistors Mn7 762 and Mn6 764 would turn on, and another glitch, or even a false switching of the node Q could potentially occur. This is avoided by the delayed pre-charge of the node X 734 via transistors Mp2 780 and Mn4 766. The transistor Mp2 780 inhibits the pre-charge of the first stage 740 before the falling edge of the delayed clock CLK2 730. The role of the transistor Mn4 766 is to additionally ensure the low level of the node X 734 when CLK2 730 is at H. Without the transistor Mn4 766, there would be no path from the node X 734 to ground in the timing window between falling edges of input clock CLK0 714 and delayed clock CLK2 730. Therefore, the node X 734 would remain at L (preventing the false switching of the flip-flop), but it would be more sensitive to noise in the flip-flop environment. Since the size of the transistor Mn4 766 is minimal, it adds additional robustness to the design with minimum performance penalty.

In sum, the embodiment of FIG. 5 shows both a delayed reset of the output Q and a delayed pre-charge of the first stage. The delayed reset is achieved by controlling the forward path from Q to the ground and by delaying the clock signal (CLK2). This leaves time for the internal node X to transition to the low level after the rising edge of the clock CLK0. The output Q is disabled until the correct value of node X is set. Consequently, the glitch that appears at Q in case of SDFF, when the H to L transition is controlled by input clock CLK0, is prevented.

This delayed reset causes the need for a delayed pre-charge of the first stage, since the second stage forward path to the ground remains open until the delayed clock (CLK2) is pulled to L. Therefore, the pre-charge of internal node X should not start before CLK2 goes to L. This is achieved by the pre-charge pMOS transistors Mp1 and Mp2 and the keeping nMOS transistor Mn5, that provides keeping node X at L after falling edge of the clock CLK0 and before the falling edge of delayed clock CLK2.

Figure 1:
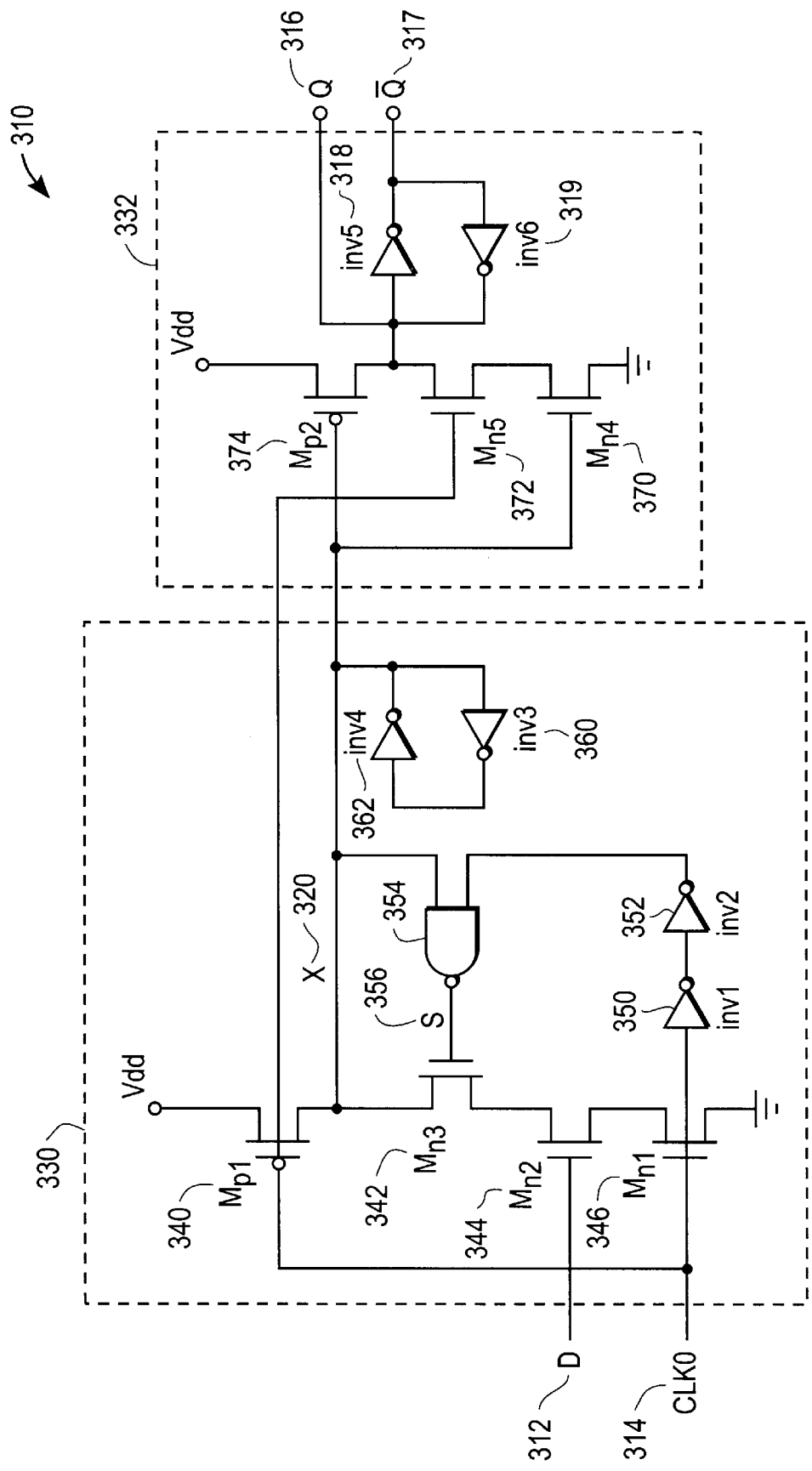
FIG. 1 shows a schematic circuit diagram of a typical prior art Semi-Dynamic Flip-Flop (SDFF)

In addition, the embodiment of FIG. 5 reduces delay, i.e., improves speed, by the input ordering of the first stage nMOS transistor stack, i.e., Mn1 754, Mn2 752, and Mn3 750 as shown in FIG. 5. Flip-flops with a transparency window are known to have a negative optimum set-up time, which means that transistors Mn1 754 and Mn2 752 are on at the time the input D 714 makes a transition; and if intermediate nodes in the first stage stack are already discharged, the overall transition of the node X 734 will be faster. In FIG. 1 Mn2 344 would be switched with Mn3 342 in order to be brought to the top of the nMOS stack. Transistor Mn2 344 would still be connected to the input D 312 and transistor Mn3 342 would still be connected to S 356, just the order in the stack would change. The charge-sharing problem that may exist is not affected by this ordering (i.e. it is neither worsened nor alleviated by this ordering), and, where needed, is treated by transistor sizing and/or placing pre-charge pMOS transistors at internal nodes on the nMOS stack.

In FIG. 5 the conditional keeper of node X keeps or maintains the low level of node X, when CLK2 is H, and keeps the high level of node X, when CLK3 is L. The conditional keeper of output Q keeps the low level of output Q, when CLK1 is H, and keeps the high level of output Q, when CLK2 is L. Each conditional keeper is off during some or all of the transparency window in order to allow node X or output Q to change without fighting their respective keepers. In one embodiment, the conditional keeper of node X is off during a beginning portion of the transparency window and the conditional keeper of output Q is off during an ending portion of the transparency window, where the beginning and ending portions may overlap either partially or fully.

Table 1 below shows the SPICE simulation results of the embodiment of FIG. 5 with the conditional keepers and the removal of the glitch, as normalized to the conventional SDFF. The input data activity is 50%.

TABLE 1

|  | Delay | Clock Power | Data Power | Total Power | EDP |
| --- | --- | --- | --- | --- | --- |
| SDFF | 1.00 | 1.00 | 1.00 | 1.00 | 1.00 |
| FIG. 5 | 1.08 | 0.81 | 0.45 | 0.68 | 0.81 |

The EDP is the Energy Delay Product. The EDP is a figure of merit and in this case is the total power dissipated ($P_{diss}$) times the delay ($t_d$) divided by the clock frequency ($f_{CLK0}$), e.g., 500 MHz. The delay includes the flip-flop setup time+ clock-to-output time. The un-normalized EDP formula is thus:

$$EDP = \frac{t_d \times P_{diss}}{f_{CLK0}}$$

As Table 1 illustrates the embodiment of FIG. 5 has substantially the same delay as the SDFF, but consumes significantly less power.

Figure 6:
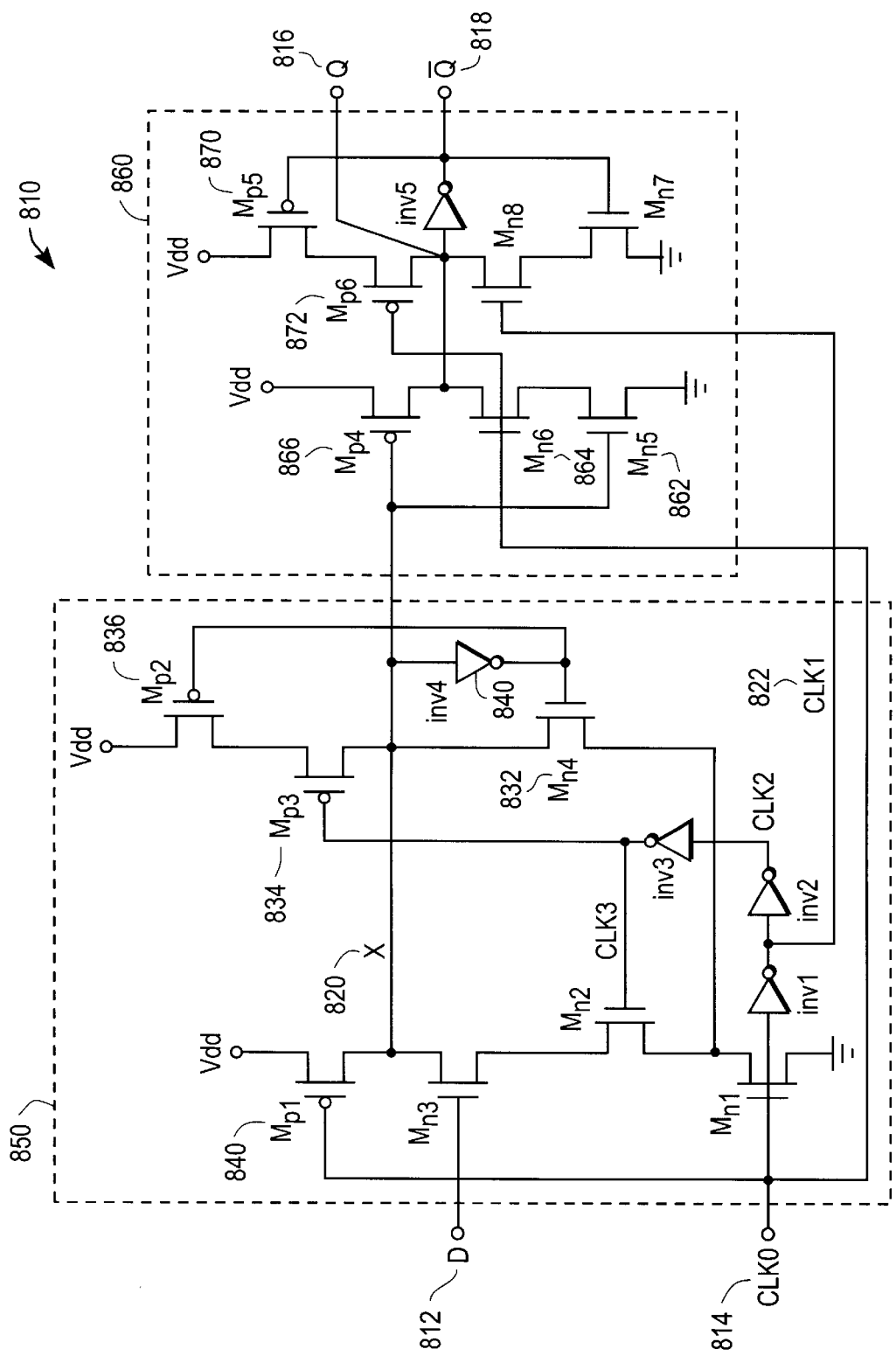
FIG. 6 is a schematic circuit diagram of a third embodiment of the present invention.

FIG. 6 is a schematic circuit diagram of a third embodiment of the present invention. All keepers in the D type flip-flop 810 are conditional, i.e. the state of the node X 820 and output Q 816 are kept (restored) only when the forward path is off. In FIG. 6 the state of the internal node X 820 is available to be changed only for the high level of the clock, i.e. CLK0 814 is H. When CLK0 is L transistor Mp1 840 is on, hence resetting node X 820 to H. The conditional keeper (Mn4 832, Mp3 834, Mp2 836, and inv4 840) of the first stage 850 keeps node X 820 at H only after the transparency window. Since Mp3 834 is off in the transparency window, the transition of node X 820 from H to L is faster because there is no need to overcome the keeper transistors Mp3 834 and Mp2 836. When CLK0 814 is H, transistor Mn6 864 is on and an inverted node X 820 logic level is passed to output Q 816. The state of the output Q 816 is kept when CLK0 814 is L and CLK1 822 is H. The output Q conditional keeper is off or disconnected, when output Q 816 is being evaluated. Thus output Q 816 need not fight the keeper in order to change, and delay is reduced.

Figure 7:
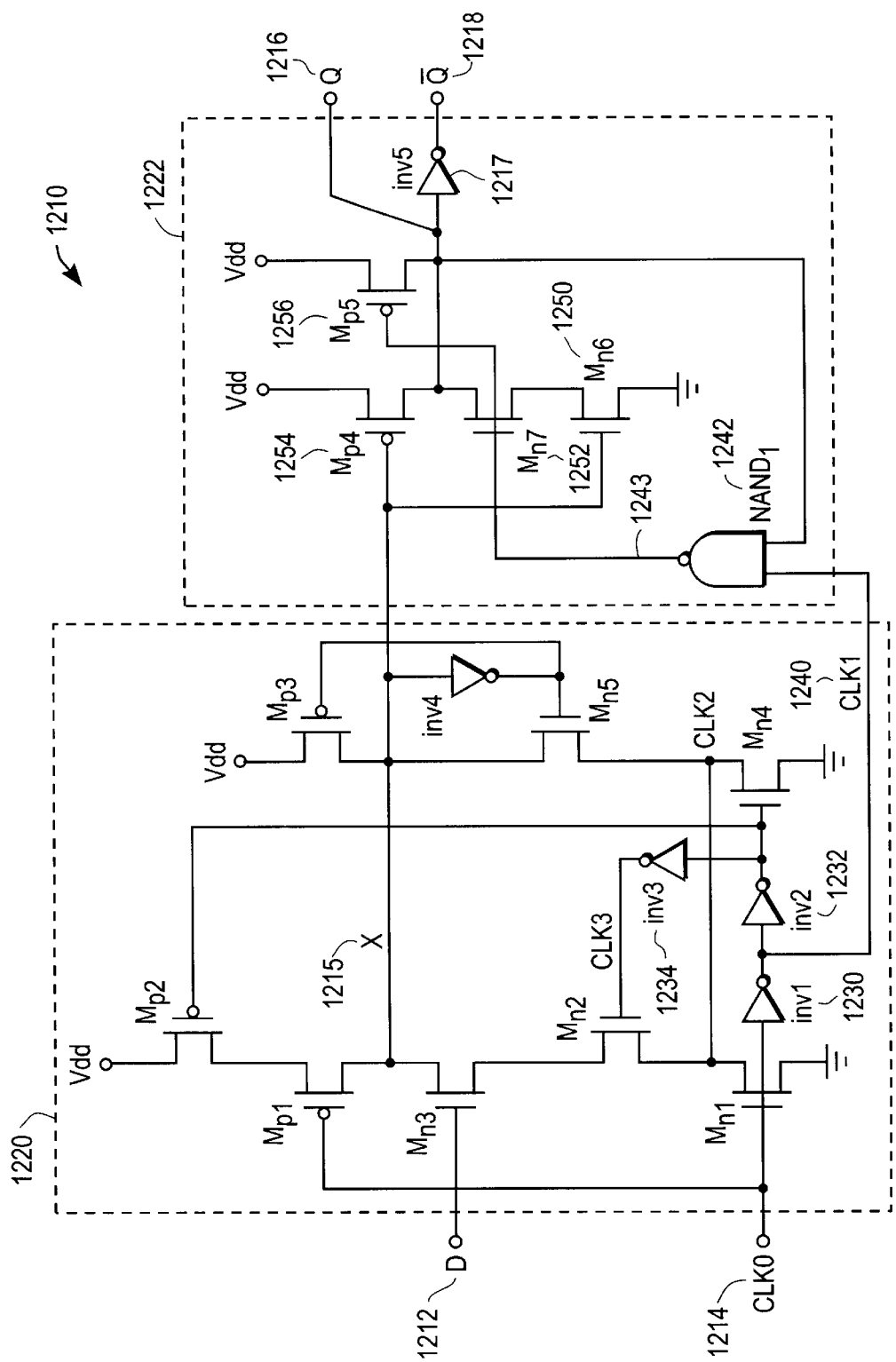
FIG. 7 is a schematic circuit diagram of another embodiment of the present invention with the keeping function of the second stage performed by a feedback NAND gate.

FIG. 7 is a schematic circuit diagram of another embodiment of the present invention with the keeping function of the second stage performed by a feedback NAND gate. The first stage 1220 is similar to and has the function of first stage 860 in FIG. 6. Node X 1215 and clock CLK1 1240 (clock CLK0 1214 inverted and delayed through inverter inv1 1230) are outputted from the first stage 1220 and inputted into the second stage 1222. The second stage 1222 has the delayed reset function of CLK2 (the clock reference signal seen by the second stage is delayed through the inverter inv1 and the NAND gate NAND1 1242). When output Q 1216 is H, then NAND1 1242 functions as an inverter for CLK1 1240 and the NAND output 1243 is CLK2. When output Q 1216 is L, NAND output 1243 is H, transistor Mn7 1252 is on, and output Q 1216 gets the inverted value of node X 1215 via transistors Mn6 1250 and Mp4 1254.

The embodiment of FIG. 7 provides delay improvements. These delay improvements are from reducing the complexity of the layout of the critical path, so that the parasitic drain diffusions and contact capacitances in the critical path are minimized.

The sizing of the transistors Mn6 1250, Mn7 1252, Mp4 1254, and Mp5 1256 in FIG. 7 can be used to improve the driving capability of the output Q, compared to the conventional flip-flop. This sizing allows the flip-flop 1210 of FIG. 12 to drive large loads even when noise spikes occur, because the strong NAND gate NAND1 1242 is much less sensitive to noise compared to the weak keeper of the second stage of the conventional flip-flop, e.g., FIG. 1 inv5 318 and inv6 319. In a noisy environment, the typical component following the flip-flop that needs the output of the conventional flip-flop, e.g., FIG. 1, uses Qbar 317 and inverts it again, rather than using Q 316. Qbar 317 is used in order to prevent noise from being injected back into output Q 316, overpowering the weak keeper, and undesirably switching the output Q 316. However, this incurs an additional delay of two inverters, over using Q directly or only one inverter, if the consumer, is willing to use Qbar instead of Q. The use of the NAND gate NAND1 1242 in FIG. 7 allows for output Q 1216 to be used directly.

Other advantages of the embodiment of FIG. 7 are: more efficient layout in the critical path, since there is little or no contact or extra diffusion capacitance between either the transistors Mn6 1250 and Mn7 1252 or at the output Q 1216; and improving the driving capability versus performance tradeoff by reducing the pMOS stack height in the keeper of the output Q 1216 from two pMOS transistors (Mp5 870, and Mp6 872 in FIG. 6 to one pMOS transistor (Mp5 1256) in FIG. 7.

Figure 8:
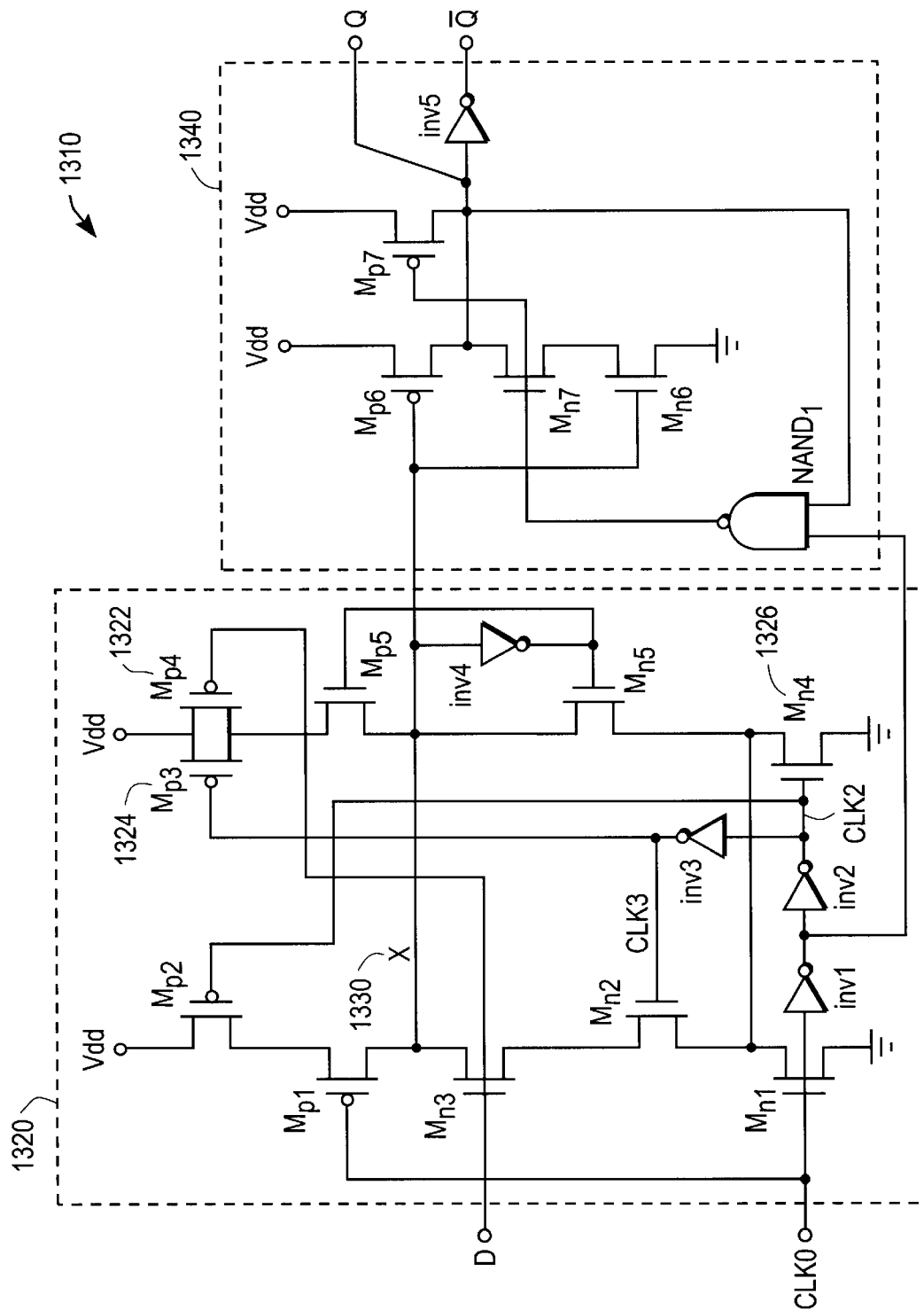
FIG. 8 is a schematic circuit diagram of yet another embodiment of the present invention with the keeping function of the second stage performed by a feedback NAND gate.

FIG. 8 is a schematic circuit diagram of yet another embodiment of the present invention with the keeping function of the second stage performed by a feedback NAND gate. The conditional keeper in the first stage is a fully complementary (dual) pMOS keeper with respect to the nMOS evaluation path. FIG. 8 has the same second stage 1340 as the second stage 1222 of FIG. 7. The first stage 1320 is similar to the first stage 1220 of FIG. 7, except the conditional keeper in the first stage 1220 of FIG. 7 is replaced by its fully static version by adding transistors Mp4 1322 and Mn4 1326, i.e., at least one conducting path can be found from node X 1330 to either ground or Vdd, but not both.

From looking at the second stages of FIGS. 7 and 8 above, it can be seen that other digital logic may be embedded in the second stage of the flip-flop. For example, in the second stage 1222 of FIG. 7, the transistors Mn6 1250, Mn7 1252, Mp4 1254, and Mp5 1256 form a static CMOS NAND gate with two inputs node X 1215 and the output 1243 of NAND1 1242, and one output, output Q 1216. It is more efficient to embed an additional digital logic circuit directly into the second stage 1222 of FIG. 7 using its static CMOS NAND gate, rather than waiting for the output Q 1216 of the second stage 1222 to be evaluated first, and then using the output Q 1216 in the additional digital logic circuit.

Figure 2:
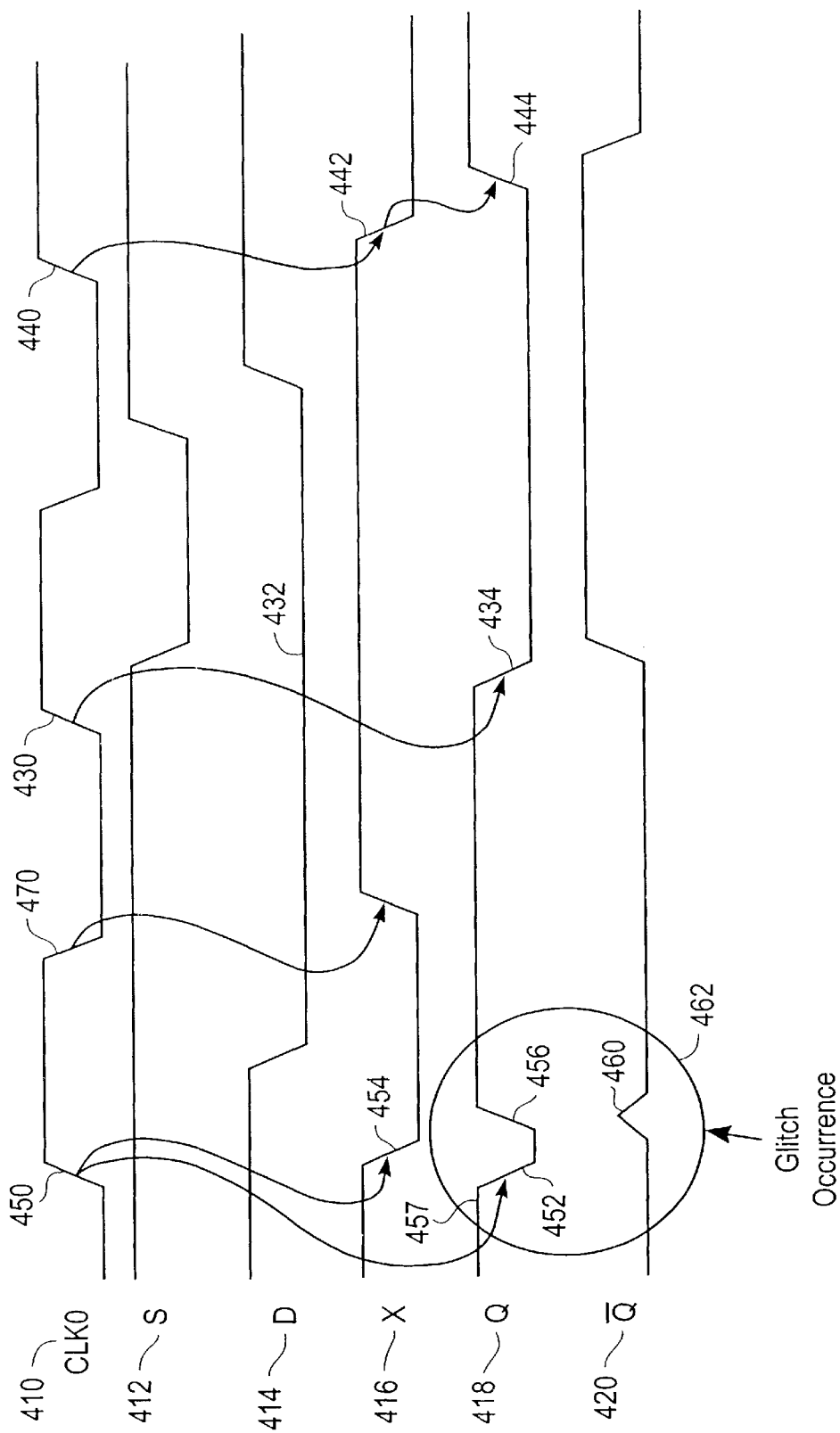
FIG. 2 is an example timing diagram for the prior art SDFF schematic circuit diagram of FIG. 1 showing a glitch in the output.
Figures 2, 9:
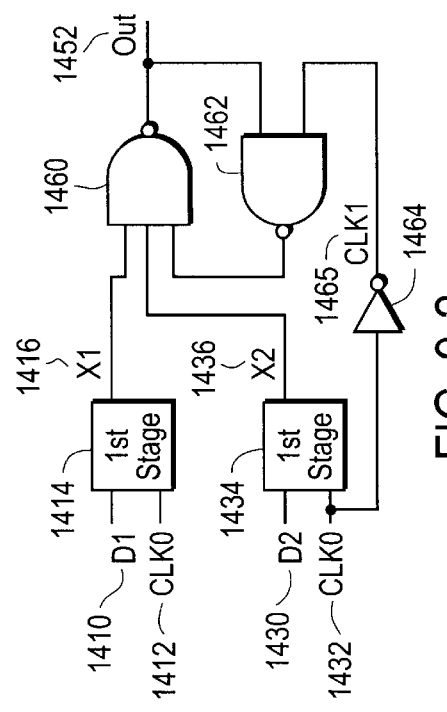
Figures 4, 9:
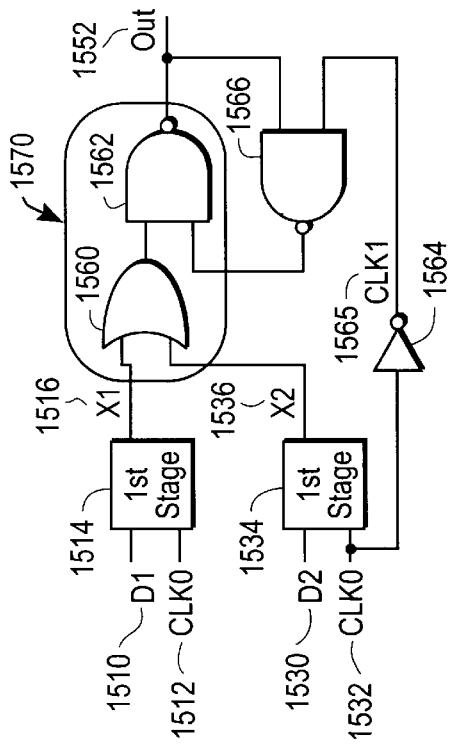
Figures 1, 9:
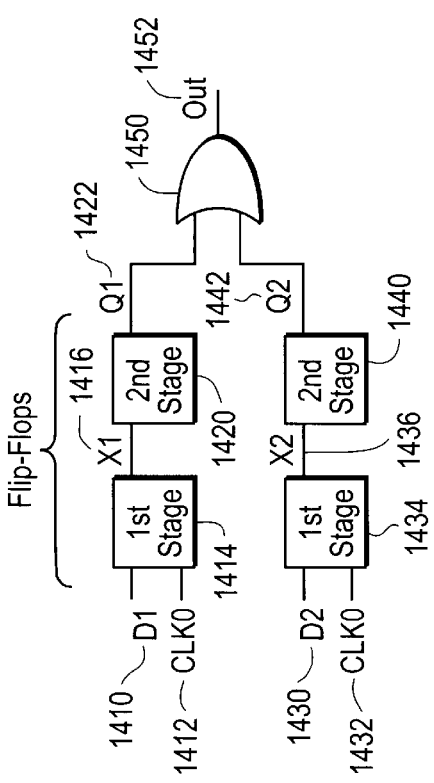
Figures 3, 9:
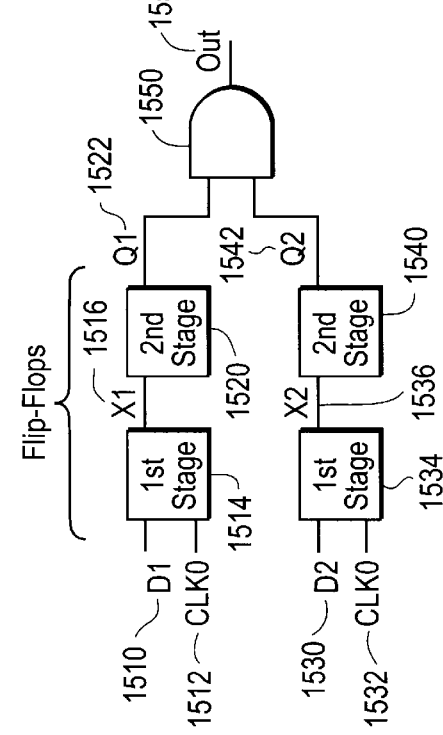

FIGS. 9-1, 9-2, 9-3 and 9-4 show examples of the second stages of two flip-flops being combined for some embodiments of the present invention. For example, the circuits in FIGS. 9-2 and FIGS. 9-4 show the equivalent of the circuits shown in FIGS. 9-1 and FIGS. 9-3, respectively.

FIGS. 9-1 has two D type flip-flops. The first flip-flop has inputs D1 1410 and CLK0 1412 into the first stage 1414, an internal node X1 1416 that connects the first stage 1414 to the second stage 1420, and output Q1 1422. The second flip-flop has inputs D2 1430 and CLK0 1432 into the first stage 1434, an internal node X2 1436 that connects the first stage 1434 to the second stage 1440, and output Q2 1442. The outputs Q1 1422 and Q2 1442 are combined in an OR gate 1450 to give output 1452.

FIGS. 9-2 has the logical equivalent circuit of FIGS. 9-1 with the two second stages 1420 and 1440, and the OR gate 1450 combined. The outputs X1 1416 and X2 1436 of the two first stages (1414 and 1434) are input along with the output of a feedback NAND gate 1462 (similar to NAND1 1242 of FIG. 7) into a three input NAND gate 1460. The output of the NAND gate 1460 is the combined circuit output OUT 1452 and is inputted into feedback NAND gate 1462, which also receives CLK1 1465, i.e., CLK0 1432 through inverter 1464.

FIGS. 9-3 has two D type flip-flops. The first flip-flop has inputs D1 1510 and CLK0 1512 into the first stage 1514, an internal node X1 1516 that connects the first stage 1514 to the second stage 1520, and output Q 11522. The second flip-flop has inputs D2 1530 and CLK0 1532 into the first stage 1534, an internal node X2 1536 that connects the first stage 1534 to the second stage 1540, and output Q2 1542. The outputs Q1 1522 and Q2 1542 are combined in an AND gate 1550 to give output 1552.

FIGS. 9-4 has the logical equivalent circuit of FIGS. 9-3 with the two second stages 1520 and 1540, and the AND gate 1550 combined. The outputs X1 1516 and X2 1536 of the two first stages (1514 and 1536) are input into OR gate 1560. The output of OR gate 1560 is input along with the output of a feedback NAND gate 1566 (similar to NAND1 1242 of FIG. 7) are inputted into a two input NAND gate 1562. The Or gate 1560 and NAND gate 1562 form an Or-And-Invert logic (OAI) single stage circuit 1570. The output of the OAI 1570 is the combined circuit output OUT 1552 and is inputted into feedback NAND gate 1566, which also receives CLK1 1565, i.e., CLK0 1532 through inverter 1564.

Since the assumption is that the additional digital logic function needs to be implemented anyway, the effective delay of the flip-flop becomes the difference between the delay of the flip-flop with additional logic embedded and the delay of the additional digital logic circuit alone. Thus the circuitry is embedded with minimal, if any, delay penalty. This embedding when done together with logic embedding in the first stage of the flip-flop, allows the entire flip-flop delay overhead to be masked.

Although specific embodiments of the invention have been described, various modifications, alterations, alternative constructions, and equivalents are also encompassed within the scope of the invention. While a transparency window of three inverters is given in some embodiments in this disclosure, the transparency window is not so limited. In an alternative embodiment there may be one or more inverters. More specifically there may be an odd number of inverters. The transparency window in other embodiments of the present invention include any time duration in which both the pre-charge or first stage and the evaluate or second stage are active. For example the transparency window in FIG. 4 is when both CLK0 612 and CLK3 668 are H, but other activation schemes as determined by one of ordinary skill in the arts may be used and are within the scope of this invention. In addition while the disclosed embodiments show a D type flip-flop, the scope of this invention includes other flip-flops, latches, and memory circuits in which there is a first or pre-charge stage and an evaluation or second stage coupled together by at least one internal node, were this internal node is charged or discharged.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set fourth in the claims.

What is claimed is:

1. A method for conditionally maintaining a logic level of a node in flip-flop circuit, the flip-flop circuit comprises a pre-charged stage coupled to an evaluation stage by said node, said method comprising:

during a first part of a periodic time interval, maintaining said logic level of said node by feeding back to said node said logic level after two inversions; and during a second part of said periodic interval, not maintaining said logic level of said node by disconnecting said feeding back to said node.

2. The method of claim 1 wherein said flip-flop circuit comprises a pre-charged stage coupled to an evaluation stage, and wherein said second part of said periodic time interval includes a portion of a transparency window.

3. The method of claim 1 wherein said flip-flop circuit comprises, a pre-charged stage coupled to an evaluation stage and wherein said node is an output of said evaluation stage.

4. The method of claim 1 wherein said flip-flop circuit is a hybrid type flip-flop circuit.

5. The method of claim 1 wherein said flip-flop circuit is a D-type flip-flop circuit.

6. The method of claim 1 wherein said flip-flop circuit comprises a pre-charged stage coupled to an evaluation stage, and wherein said first part of said periodic time interval, includes a portion of a transparency window.

7. A method for conditionally maintaining a logic level of an output node in flip-flop circuit, the flip-flop circuit having a pre-charged stage coupled to an evaluation stage at an internal node, the output node being an output of the evaluation stage, said method comprising:

during a first part of a periodic time interval, maintaining the logic level of the output node by feeding back to the output node the logic level after two stages of inversion; and during a second part of the periodic interval, not maintaining the logic level of the output node by placing the second stage of inversion in a high-impedance state regardless of the value of the internal node, thereby disconnecting the feeding back of the logic level to the output node.

8. A conditional keeper circuit for conditionally maintaining a logic level of a node in flip-flop circuit, said flip-flop circuit comprising a pre-charged stage coupled to an evaluation stage by said node, said conditional keeper circuit comprising:

an inverter circuit connected to said node;

an inverted tri-state circuit connected to said inverter circuit and to said node; and a control circuit sending a signal to set said inverted tri-state circuit to a high impedance state for a fixed time period.

9. The conditional keeper circuit of claim 11 wherein said control circuit sends said signal when said inverted clock signal has a low logic level or when said delayed clock signal has a high logic level.

10. The conditional keeper circuit of claim 8 wherein said node is an output of said evaluation stage.

11. The conditional keeper circuit of claim 8 further comprising: a clock signal; an inverted clock signal comprising a first output of a first inverter having said clock signal as a first input; a delayed clock signal comprising a second output of a second inverter having said first output as a second input; and an inverted delayed clock signal comprising a third output of a third inverter having said second output as a third input.

12. The conditional keeper circuit of claim 11 wherein said control circuit sends said signal when said delayed clock signal has a low logic level and said inverted delayed clock signal has a high logic level.

13. The conditional keeper circuit of claim 11 wherein said control circuit sends said signal when said delayed clock signal has a low logic level or when said inverted delayed clock signal has a high logic level.

14. The conditional keeper circuit of claim 11 wherein said control circuit sends said signal when said inverted clock signal has a low logic level and said delayed clock signal has a high logic level.

15. A conditional keeper circuit for conditionally maintaining a logic level of a node in flip-flop circuit, said flip-flop circuit comprising a pre-charged stage coupled to an evaluation stage at an internal node, said conditional keeper circuit comprising:

an inverter circuit connected to said node;

an inverted tri-state circuit connected to said inverter circuit and to said node; and a control circuit sending a signal to set said inverted tri-state circuit to a high impedance state for a fixed time period regardless of the value of the internal node between the pre-charge stage and the evaluation stage.

16. A method for reducing delay in a flip-flop, said flip-flop comprising a pre-charged stage coupled to an evaluation stage by at least an internal node, said method comprising:

disconnecting a first keeping circuit of said pre-charged stage in a part of a transparency window, wherein said first keeping circuit maintains a first logic level on said internal node; and setting said internal node to a second logic value after said disconnecting said first keeping circuit.

17. The method of claim 16 further comprising:

disconnecting a second keeping circuit of said evaluation stage in said part of said transparency window, wherein said second keeping circuit maintains a third logic level on an output of said evaluation stage; and setting said output to a fourth logic level based on said second logic value after said disconnecting said second keeping circuit.

18. The method of claim 16 further comprising:
disconnecting a second keeping circuit of said evaluation stage in another part of said transparency window, wherein said second keeping circuit maintains a third logic level on an output of said evaluation stage; and
setting said output to a fourth logic level based on said second logic value after said disconnecting said second keeping circuit.

19. The method of claim 18 wherein said part and said another part are overlapping.

20. The method of claim 16 wherein said flip-flop is a hybrid type flip-flop.

21. The method of claim 20 wherein said hybrid type flip-flop is a D type flip-flop.

22. The method of claim 16 wherein said transparency window comprises a time period when said internal node is logically equivalent to an inverted value of a data input into said pre-charge stage.

23. A system for improving speed in a hybrid type flip-flop comprising:
a pre-charge stage for determining a pre-charge stage output depending upon a data input during a first part of a transparency window, said pre-charge stage comprising a first conditional keeper for keeping said pre-charge stage output; and
an evaluation stage for evaluating said pre-charge stage output to produce a data output during a second part of said transparency window, said evaluation stage comprising a second conditional keeper for keeping said data output;
wherein when outside of said transparency window either said first conditional keeper is operating like a first unconditional keeper or said second conditional keeper is operating like a second unconditional keeper.

24. The system of claim 23 wherein said pre-charge stage further comprises an nMOS transistor stack, wherein an nMOS transistor for said data input is at a top of said nMOS transistor stack.

25. The system of claim 23 wherein said first conditional keeper includes a plurality of pMOS transistors in series coupled to a plurality of nMOS transistors in series, wherein a pMOS transistor of said plurality of pMOS transistors is part of a conditional control circuit of said first conditional keeper.

26. The system of claim 23 wherein said first conditional keeper includes a plurality of pMOS transistors in series coupled to a plurality of nMOS transistors in series, wherein a pMOS transistor of said plurality of pMOS transistors and an nMOS transistor of said plurality of nMOS transistors are part of a conditional control circuit of said second conditional keeper.

27. The system of claim 23 further comprising:
a clock signal;
an inverted delayed clock signal, wherein said transparency window includes a time period when said clock signal is at a first high logic level and when said inverted delayed clock signal is at a second high logic level; and
a delayed clock signal for disabling said evaluation stage during said first part of said transparency window, wherein said disabling comprises preventing said evaluation stage from setting said data output to a first low logic level.

28. A method for reducing delay in a flip-flop, the flip-flop comprising a pre-charged stage coupled to an evaluation stage by at least an internal node, said method comprising:
disconnecting a first keeping circuit of said pre-charged stage in at least a first portion of a transparency window, wherein said first keeping circuit maintains a first logic level on said internal node;
setting said internal node to a second logic value after said disconnecting said first keeping circuit;
disconnecting a second keeping circuit of said evaluation stage in at least a second portion of said transparency window, wherein said second keeping circuit maintains a third logic level on an output of said evaluation stage; and
setting said output to a fourth logic level based on said second logic value after said disconnecting said second keeping circuit.

29. The method of claim 28 wherein said flip-flop is a hybrid type flip-flop.

30. The method of claim 28 wherein said flip-flop is a D type flip-flop.

31. A system for improving performance of a hybrid type flip-flop, comprising:
a pre-charge stage for receiving a data input and setting an internal node; and
an evaluation stage for setting a data output, wherein said evaluation stage is connected to said pre-charge stage by said internal node, wherein said evaluation stage comprises a plurality of NAND gates, and wherein said data output is feedback into a NAND gate of said plurality of NAND gates.

32. The system of claim 31 wherein said hybrid type flip-flop is a D type flip-flop.

33. A method for combining an evaluation stage of a hybrid flip-flop coupled to external digital logic circuitry, wherein said evaluation stage comprises a plurality of NAND gates, said method comprising:
identifying external logic gates in said external digital logic circuitry;
performing a Boolean logic minimization using said external logic gates and said plurality of NAND gates; and
combining said evaluation stage and said external logic gates.

34. The system method of claim 33 wherein said external logic gates include another evaluation stage of another hybrid flip-flop.

35. The system method of claim 34 wherein said external logic gates further includes at least one logic gate connected to said evaluation stage and to said another evaluation stage.

36. A conditional keeper circuit for conditionally maintaining a logic level of a node in flip-flop circuit, said flip-flop circuit comprising a pre-charged stage coupled to an evaluation stage, said conditional keeper circuit comprising:
an inverter circuit connected to said node;
an inverted tri-state circuit connected to said inverter circuit and to said node;
a control circuit sending a signal to set said inverted tri-state circuit to a high impedance state for a fixed time period;
a clock signal;
an inverted clock signal comprising a first output of a first inverter having said clock signal as a first input;
a delayed clock signal comprising a second output of a second inverter having said first output as a second input; and an inverted delayed clock signal comprising a third output of a third inverter having said second output as a third input.

37. The conditional keeper circuit of claim 36 wherein said control circuit sends said signal when said inverted clock signal has a low logic level or when said delayed clock signal has a high logic level.

38. The conditional keeper circuit of claim 36 wherein said control circuit sends said signal when said inverted clock signal has a low logic level and said delayed clock signal has a high logic level.

39. The conditional keeper circuit of claim 36 wherein said control circuit sends said signal when said delayed clock signal has a low logic level and said inverted delayed clock signal has a high logic level.

40. The conditional keeper circuit of claim 36 wherein said control circuit sends said signal when said delayed clock signal has a low logic level or when said inverted delayed clock signal has a high logic level.

* * * * *